United States Patent [19]
Rowlette

[11] Patent Number: 5,334,330
[45] Date of Patent: Aug. 2, 1994

[54] ANISOTROPICALLY ELECTRICALLY CONDUCTIVE COMPOSITION WITH THERMAL DISSIPATION CAPABILITIES

[75] Inventor: John R. Rowlette, Clemmons, N.C.

[73] Assignee: The Whitaker Corporation, Wilmington, Del.

[21] Appl. No.: 502,478

[22] Filed: Mar. 30, 1990

[51] Int. Cl.$^5$ .................... H01B 1/00; H01B 1/20
[52] U.S. Cl. .................... 252/512; 252/511; 252/518; 174/88 R; 428/206; 428/339; 156/656; 439/91
[58] Field of Search .................... 252/511, 512, 518; 174/84 R, 88 R; 428/206, 208, 209, 356, 339; 156/656, 663; 439/89, 90, 91

[56] References Cited

U.S. PATENT DOCUMENTS

| | | | |
|---|---|---|---|
| 4,170,677 | 10/1979 | Hutcheson | 428/119 |
| 4,252,391 | 2/1981 | Sado | 339/60 R |
| 4,568,592 | 2/1986 | Kawaguchi et al. | 428/339 |
| 4,606,962 | 8/1986 | Reylek et al. | 428/206 |
| 4,699,831 | 10/1987 | Hartmann et al. | 252/518 |
| 4,701,279 | 10/1987 | Kawaguchi et al. | 252/518 |
| 4,729,809 | 3/1988 | Dery et al. | 156/306.6 |
| 4,737,112 | 4/1988 | Jin et al. | 428/356 |
| 4,740,657 | 4/1988 | Tsukagoshi et al. | 174/84 R |
| 4,770,641 | 9/1988 | Rowlette | 439/86 |
| 4,960,490 | 10/1990 | Berg et al. | 156/656 |
| 5,049,085 | 9/1991 | Reylek et al. | 439/91 |
| 5,084,211 | 1/1992 | Kawaguchi et al. | 252/511 |

*Primary Examiner*—Paul Lieberman
*Assistant Examiner*—M. Kopec
*Attorney, Agent, or Firm*—William B. Noll; Timothy J. Aberle

[57] ABSTRACT

An anisotropically electrically conductive composition having the capability to conduct heat isotropically when used as an electrical interconnection medium between a pair of electrical conductors, paths, traces, or the like. The composition comprises a mixture of electrically conductive particles in an amount below the percolation threshold for volume conduction for such composition, and electrically non-conductive, but thermally conductive particles, such as metallic oxides, within a polymeric matrix. Preferably, the conductive particles are present in an amount of no more than about 15%, by volume, and the electrically non-conductive particles are present in an amount of about 15 to 35%, by volume.

5 Claims, 1 Drawing Sheet

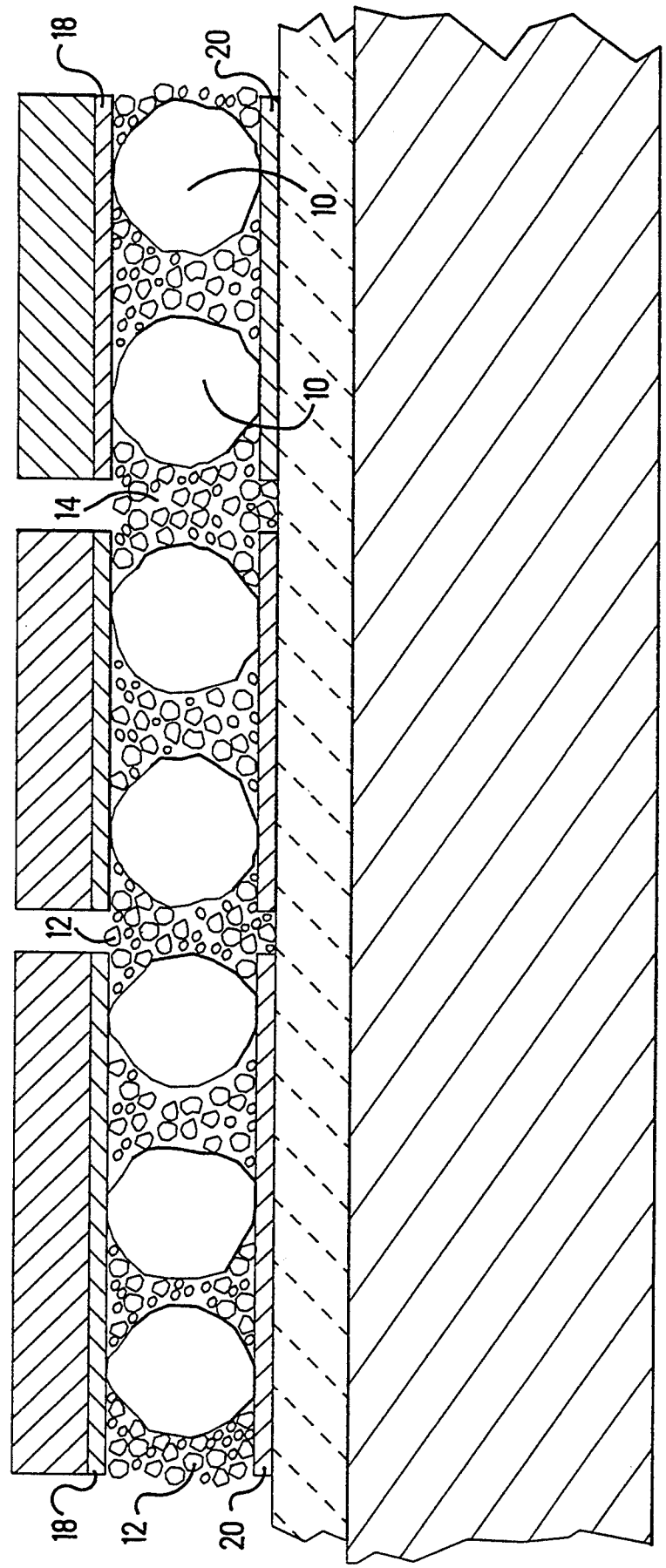

ANISOTROPICALLY ELECTRICALLY CONDUCTIVE COMPOSITION WITH THERMAL DISSIPATION CAPABILITIES

RELATED INVENTION

This invention is directed to an improvement over the invention disclosed in U.S. Pat. No. 4,770,641 to Rowlette.

BACKGROUND OF THE INVENTION

The invention, as more fully described hereinafter, relates to an anisotropically electrically conductive composition, such as a gel, having the further attribute of being able to isotropically conduct heat.

Electrically conductive compositions, such as gels or adhesives, have become recognized systems for electrically interconnecting conductive areas or conductors on a pair of substrates. By way of example, polymeric electrically conductive materials, such as conductive epoxies and thermoplastic adhesives, have been used to establish interconnections for electrical circuitry. Conductive epoxies have been employed to mount electrical components on printed circuit boards. Polymeric electrically conductive adhesives have also been employed in tape form to interconnect conductors on a substrate with other components or circuitry. When used to establish such electrical interconnections, these conductive epoxies and conductive adhesives can be deposited on a surface in a conventional manner, such as by screen printing. Then upon the application of heat and pressure or upon the application of pressure, depending upon the precise character of the conductive adhesive, both electrical and structural or mechanical integrity can be established between separate conductors. For more information on conductive gel interconnection systems, see U.S. Pat. No. 4,770,641 to Rowlette.

Conductive adhesives, as more fully described in U. S. Pat. No. 4,729,809 to Dery et al, comprise a mixture of conductive particles in a nonconductive adhesive binder. Dery et al is specifically directed to an anisotropically conductive adhesive which will permit electrical conductivity normal to the plane of the substrate to which the adhesive has been applied, while precluding conductivity between adjacent conductive areas in the plane of the substrate. By way of brief reference, insofar as electrical interconnection devices are concerned, a gel may be described as a disconnectable composition, whereas an adhesive is non-disconnectable.

U.S. Pat. No. 4,170,677 to Hutcheon discloses an earlier version-of an anisotropically conductive adhesive composition. This disclosure reveals the use of whisker-like particles which are either paramagnetic or ferromagnetic. Once the adhesive is coated on a substrate, the substrate must be exposed to a magnetic or electrical field to make the conductive whiskers align perpendicular to the substrate. The adhesive must then be hardened while the field is still applied.

U.S. Pat. No. 4,252,391 to Sado discloses a method for preparing. anisotropically pressure-sensitive electroconductive composite sheets. These sheets are comprised of electrically conductive fibers that have been distributed in a matrix of an electrically insulating substance. The fibers are aligned in a direction substantially perpendicular to the plane of the sheet.

The present invention further improves upon the subject of conductive compositions by providing for the further capability of being able to dissipate heat therefrom. This is a highly valuable advantage because, as known in the art, the conductive electrical energy lost in conduction, i.e. resistance, is converted to heat energy. The present invention provides for a system to remove or dissipate the heat from the conductive composition, thereby resulting in a more efficient and effective interconnector system. The unique features of this invention will become mare apparent from the description which follows.

BRIEF DESCRIPTION OF DRAWINGS

The FIGURE is a simplified illustration of the use of an anisotropically electrically conductive composition, which features the further characteristic of isotropically heat conduction, according to this invention.

SUMMARY OF THE INVENTION

The invention relates to an anisotropically electrically conductive composition having the capability to more efficiently conduct heat isotropically when used as an electrical interconnection medium between a pair of electrical conductors. The composition comprises a mixture of particles which are both electrically and thermally conductive in an amount below the percolation threshold for volume electrical and thermal conduction for such composition, and electrically non-conductive, but thermally conductive particles, such as metallic oxides, within a polymeric matrix. In a preferred embodiment the electrically conductive particles are present in an amount of less than about 15%, by volume, and said electrically non-conductive particles are present in an amount of about 15 to 35%, by volume.

DETAILED DESCRIPTION OF PREFERRED EMBODIMENT

The conductive gel employed in the preferred embodiment of this invention comprises a polymerizable gel-like material. The preferred composition is a conductive gel formed by dispersing a plurality of electrically conductive particles 10, and a plurality of electrically non-conductive, but thermally conductive particles 112, within a thin gelatinous dielectric medium 14, see the Figure for an exemplary application thereof. Electrical conduction is achieved between conductor traces 18,20. According to the prior art, to form a fully conductive gel, it was necessary to load the gel to a concentration in an amount at least equal to or above the percolation threshold. The percolation threshold is the lower limit of the volumetric concentration of randomly distributed conductive particles within a dielectric medium which would result in bulk conductivity. The percolation threshold, in order to achieve conductivity, is generally on the order of 20 to 25% by volume of conductive particles in a dielectric medium.

During the course of the investigation leading to this invention, it was discovered that the addition of thermally conductive but electrically non-conductive particles significantly enhanced the thermal dissipation while maintaining electrical anisotropy of the interconnection means. Further, by this invention, it was possible to limit such electrically conductive particles to an amount below the percolation threshold, preferably a maximum of 15%, by volume, nominally about 10 to 12%, while limiting the total loading thereof to no more than about 50%, by volume.

Significant properties of this conductive gel are attributable to the dielectric medium employed. This dielectric medium must be selected such that the conductive gel will exhibit a certain memory-like viscosity such that it will accept numerous intermating geometric forms and will conform to the surface area of the conductors to be intermated. The dielectric gel should also tend to self-heal, or return to its original shape, when the conductors are removed. In other words, the conductive gel must be conformable to the interface between the connector and the electrical conductors while the conductors are interconnected, but must return to its original shape after removal of the conductors. This latter characteristic implicitly requires the gelatinous dielectric medium to form a coherent non-flowable mass and then exhibit greater coherence than adhesion to the extraneous conductors mated therewith. In other words, the conductive gel should not stick to the conductors upon disengagement.

Certain silicone gels exhibit the physical characteristics for use in the invention described herein. One such silicone gel, comprising the preferred embodiment of this invention, is a dielectric two-component transparent silicone encapsulant specifically designed to seal, protect, and preserve the electrical characteristics of electrical components embedded therein and marketed under the trademark Sylgard 527 by Dow Corning Corporation. Sylgard 527, a registered trademark of Dow Corning Corporation, is a solventless heat curable silicone gel consisting of the vinyl and hydride reactive functional groups, which when mixed in a one-to-one ration under the influence of a platinum catalyst, results in a cured material characterized as a cushioning, self-healing, resilient gel-like mass. This gel has some of the stress relief and self-healing properties of a liquid but is dimensionally stable and nonflowing. In other words, the gel is characterized by the absence of substantial shear stresses. This gel is resilient and exhibits some of the characteristics of a solid elastomer. The material is hydrophobic and forms a seal with the electrical conductors inserted therein. This material is deformable and will conform to the contours of a housing cavity in which is it deposited as well as conforming to the interface with conductors inserted into engagement therewith. Thus, this gel will conform to a flat surface such as the traces on the surface of a printed circuit board, pad grid array, or other substrate.

The electrically conductive particles may comprise a number of materials, as known in the art. For example, silver-coated nickel particles, silver-coated glass particles or metal plated polymeric particles or spheres could each be advantageously employed in the preferred embodiment of this invention. Solid silver spheres or silver flakes might also be employed. These should be in the size range of 25–40 microns to achieve single particle conduction.

With regard to the thermally conductive particles, which are preferably small in size, such particles, in the range of about 1 micron, are dispersed within the dielectric medium in an amount of about 30 to 50%, by volume, achieving an overall volume percent loading of no more than about 50%. A desirable material is a metal oxide, such as aluminum oxide ($Al_2O_3$).

With the conductive composition of this invention, it is now possible to fabricate an electrical interconnection system, for example, between a pair of conductive areas, traces, or conductors on opposing substrates, such as a pair of printed circuit boards, or pad array and a circuit board, which are not only electrically conductive anisotropically but also provides more efficient thermal conduction of heat isotropically through the interconnection.

I claim:

1. An anisotropically electrically conductive composition having the capability to more efficiently conduct heat anisotropically when used as an electrical interconnection medium between a pair of electrical conductors, said composition comprising a mixture of electrically conductive particles in an amount below the percolation threshold for volume conduction for such composition, and electrically non-conductive, but thermally conductive particles, within a polymeric matrix, where said particles are present in an amount of no more than 50% by volume, with the minimum amounts of each being those amounts sufficient to render said composition electrically and thermally conductive.

2. The anisotropically electrically conductive composition according to claim 1 wherein said electrically conductive particles are present in an amount of no more than about 15%, by volume, and said electrically non-conductive particles are present in an amount of about 15 to 35%, by volume.

3. The anisotropically electrically conductive composition according to claim 2 wherein said electrically non-conductive particles are metallic oxides having a particle size distribution with an average of about 1 micron.

4. The anisotropically electrically conductive composition according to claim 3 wherein said electrically non-conductive particles are $Al_2O_3$.

5. The anisotropically electrically conductive composition according to claim 2 wherein said electrically conductive particles are present in an amount between about 10 to 12%.

* * * * *